(12) United States Patent
Matsuda et al.

(10) Patent No.: US 11,594,601 B2
(45) Date of Patent: Feb. 28, 2023

(54) SEMICONDUCTOR APPARATUS

(71) Applicant: FLOSFIA INC., Kyoto (JP)

(72) Inventors: Tokiyoshi Matsuda, Kyoto (JP); Masahiro Sugimoto, Kyoto (JP); Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 102 days.

(21) Appl. No.: 16/764,622

(22) PCT Filed: Nov. 15, 2018

(86) PCT No.: PCT/JP2018/042349
§ 371 (c)(1),
(2) Date: May 15, 2020

(87) PCT Pub. No.: WO2019/098298
PCT Pub. Date: May 23, 2019

(65) Prior Publication Data
US 2020/0403070 A1    Dec. 24, 2020

(30) Foreign Application Priority Data

Nov. 15, 2017  (JP) .............................. JP2017-219763

(51) Int. Cl.
*H01L 29/24*     (2006.01)
*C23C 16/40*     (2006.01)
(Continued)

(52) U.S. Cl.
CPC .............. *H01L 29/24* (2013.01); *C23C 16/40* (2013.01); *H01L 21/02565* (2013.01);
(Continued)

(58) Field of Classification Search
CPC ............... H01L 29/24; H01L 21/02565; H01L 21/02631; H01L 21/443; H01L 29/66969;
(Continued)

(56) References Cited

U.S. PATENT DOCUMENTS 4,235,695 A * 11/1980 De Nora ............... C25B 11/043
 204/268
5,763,655 A *  6/1998 Patois ..................... C07C 51/14
 562/522

(Continued)

FOREIGN PATENT DOCUMENTS

EP    2 276 066    1/2011
JP    8-227793     9/1996
(Continued)

OTHER PUBLICATIONS

Kentaro Kaneko, "Growth and Physical Properties of Corundum-Structured Gallium Oxide Alloy Thin Films", Kyoto University, pp. 1-116, Mar. 2013, with English abstract.

(Continued)

*Primary Examiner* — S M Sohel Imtiaz
(74) *Attorney, Agent, or Firm* — Wenderoth, Lind & Ponack, L.L.P.

(57) ABSTRACT

A semiconductor apparatus capable of reducing the leakage current in the reverse direction, and keeping characteristics thereof, even when using n type semiconductor (gallium oxide, for example) or the like having a low-loss at a high voltage and having much higher dielectric breakdown electric field strength than SiC is provided. A semiconductor apparatus includes a crystalline oxide semiconductor having a corundum structure as a main component, and an electric field shield layer and a gate electrode that are respectively laminated directly or through other layers on the n type semiconductor layer, wherein the electric field shield layer includes a p type oxide semiconductor, and is embedded in the n type semiconductor layer deeper than the gate electrode.

22 Claims, 13 Drawing Sheets

(51) Int. Cl.
*H01L 21/02* (2006.01)
*H01L 21/443* (2006.01)
*H01L 21/465* (2006.01)
*H01L 29/06* (2006.01)
*H01L 29/66* (2006.01)
*H01L 29/78* (2006.01)
*H02M 3/335* (2006.01)

(52) U.S. Cl.
CPC ...... *H01L 21/02631* (2013.01); *H01L 21/443* (2013.01); *H01L 21/465* (2013.01); *H01L 29/063* (2013.01); *H01L 29/66969* (2013.01); *H01L 29/7806* (2013.01); *H01L 29/7813* (2013.01); *H02M 3/33576* (2013.01)

(58) Field of Classification Search
CPC ............. H01L 29/7397; H01L 29/7813; H01L 29/0834; H01L 29/04; H01L 29/1095; H01L 29/41766; H01L 21/02579; H01L 21/02628; H01L 21/02483; H01L 21/02576; H01L 21/28; H01L 29/872; H01L 29/47; C23C 16/4481; H02M 3/33576

See application file for complete search history.

(56) References Cited

U.S. PATENT DOCUMENTS

| | | | | |
|---|---|---|---|---|
| 5,989,785 | A * | 11/1999 | Ishihara | H05B 33/10 430/313 |
| 9,349,856 | B2 * | 5/2016 | Oka | H01L 29/7811 |
| 2010/0127255 | A1 * | 5/2010 | Allen | H01L 29/22 257/43 |
| 2013/0265724 | A1 * | 10/2013 | Kaneko | H01L 25/07 361/715 |
| 2014/0252369 | A1 * | 9/2014 | Lee | H01L 29/24 257/76 |
| 2015/0318347 | A1 * | 11/2015 | Falck | H01L 29/7397 257/170 |
| 2015/0325660 | A1 * | 11/2015 | Hitora | H01L 29/66666 257/43 |
| 2016/0079238 | A1 * | 3/2016 | Siemieniec | H01L 29/7806 257/140 |
| 2016/0225891 | A1 * | 8/2016 | Hiyoshi | H01L 27/0727 |
| 2016/0359042 | A1 * | 12/2016 | Tateshita | H01L 29/42312 |
| 2017/0012108 | A1 * | 1/2017 | Sakakibara | H01L 21/2033 |
| 2017/0077299 | A1 * | 3/2017 | Shimizu | H01L 29/7813 |
| 2020/0273983 | A1 * | 8/2020 | Nakano | H01L 21/0465 |

FOREIGN PATENT DOCUMENTS

| | | |
|---|---|---|
| JP | 9-25255 | 1/1997 |
| JP | 11-21687 | 1/1999 |
| JP | 2005-340308 | 12/2005 |
| JP | 2012-15224 | 1/2012 |
| JP | 2013-58637 | 3/2013 |
| JP | 2014-209540 | 11/2014 |
| JP | 2015-159271 | 9/2015 |
| JP | WO2016/013554 | 1/2016 |
| JP | 2016-18900 | 2/2016 |
| JP | 2016-25256 | 2/2016 |
| JP | 2016025256 A * | 2/2016 |
| JP | 2017-55005 | 3/2017 |
| WO | 2006/020043 | 2/2006 |
| WO | WO-2016075927 A1 * | 5/2016 ........... H01L 29/872 |

OTHER PUBLICATIONS

Tatsuya Takemoto, "Power-Semiconductor Gallium Oxide" EE Times Japan, http://eetimes.jp/ee/articles/1402/27/news028_2.html, Feb. 2014, with English translation.
F.P. Koffyberg, "Optical Bandgaps and Electron Affinities of Semiconducting $Rh_2O_3(I)$ and $Rh_2O_3(III)$", J. Phys. Chem. Solids, vol. 53, No. 10, pp. 1285-1288, 1992.
Hideo Hosono, "Functional Development of Oxide Semiconductors," Physical Properties Research and Electronic Version, vol. 3, No. 1, 031211, Nov. 2013-Feb. 2014 Merger, with English translation.
Written Opinion of the International Searching Authority dated Feb. 5, 2019 in International (PCT) Patent Application No. PCT/JP2018/042349, with English translation.
International Search Report dated Feb. 5, 2019 in International (PCT) Patent Application No. PCT/JP2018/042349.
Extended European Search Report dated Jun. 24, 2021 in corresponding European Patent Application No. 18878104.1.
Office Action dated Feb. 14, 2022 in corresponding Taiwanese Patent Application No. 107140621 with English-language translation.

* cited by examiner

SURFACE ROUGHNESS (Ra): 3.5nm

FILM THICKNESS: 220nm (STEP PROFILER)

SURFACE ROUGHNESS (Ra): 302nm

FILM THICKNESS: 280nm (STEP PROFILER)

SEMICONDUCTOR APPARATUS

TECHNICAL FIELD

The disclosure relates to a semiconductor apparatus and a system using a p-type oxide semiconductor.

BACKGROUND

As a next-generation switching device capable of realizing high withstand voltage, low-loss, and high heat resistance, a semiconductor apparatus using gallium oxide ($Ga_2O_3$) having a large bandgap is paid attention, and application to power semiconductor devices such as inverters is expected. Moreover, due to its band gap, it is also expected to be applied as a light emitting device such as an LED and a sensor. According to Non-Patent Document 1, a band gap of the gallium oxide can be controlled by making mixed crystal such as mixing indium and aluminum, respectively, or mixing by combining indium and aluminum. It constitutes a material which is extremely attractive as a InAlGaO type semiconductor. Here, InAlGaO type semiconductor denotes $In_XAl_YGa_ZO_3$ ($0 \leq X \leq 2$, $0 \leq Y \leq 2$, $0 \leq Z \leq 2$, $X+Y+Z=1.5$ to $2.5$), and can be viewed as the same material system as one containing gallium dioxide.

In recent years, gallium-oxide-based p type semiconductors have been investigated, and, for example, in Patent Document 1, it is described that substrates exhibiting p type conductivity are obtained by forming β-$Ga_2O_3$ based crystals by the FZ method using MgO (p-type dopant source). Patent Document 2 describes that a p type dopant is injected into an α-$(Al_xGa_{1-x})_2O_3$ single-crystal film formed by MBE method to form a p type semiconductor. However, it is virtually difficult to manufacture p type semiconductors by using these methods (see Non-Patent Document 2), and it has not been reported that p type semiconductors have been successfully manufactured by these methods. Therefore, it has been desired to realize a p type oxide semiconductor and a manufacturing method thereof.

In addition, as described in Non-Patent Document 3 and Non-Patent Document 4, the use of, for example, $Rh_2O_3$ or $ZnRh_2O_4$ for p type semiconductors has been investigated, however, $Rh_2O_3$ has problems that the raw material density is particularly thin during deposition step and affects deposition, and even if organic solvents are used, it has been difficult to produce $Rh_2O_3$ single crystals. In addition, even if the Hall-effect measurement is performed, it is not determined to be a p type, and the measurement itself is not completed, and the measured values, for example, Hall coefficients indicate equal to or lower than the measurement limit (0.2 $cm^3/C$), and therefore, they have not been used. In addition, due to the low mobility of $ZnRh_2O_4$ and the narrow band gaps, there are problems that can hardly applied to LEDs and power devices, and these were not necessarily satisfactory.

Other than $Rh_2O_3$ and $ZnRh_2O_4$, a variety of p-type dioxide semiconductors have been examined as wide band gap semiconductors. Patent Document 3 describes the use of delafocyte, oxychalcogenide, or the like as a p-type semiconductor. However, there is also a problem that these semiconductors have a mobility of about 1 $cm^2/V \cdot s$ or less, electrical characteristics are poor, and pn coupling with n type next-generation dioxide semiconductors such as α-$Ga_2O_3$ cannot be realized.

Conventionally, $Ir_2O_3$ is known. For example, Patent Document 4, describes using $Ir_2O_3$ as an iridium catalyst. Further, Patent Document 5 describes using $Ir_2O_3$ for a dielectric. Further, Patent Document 6 describes using an $Ir_2O_3$ for the electrodes. However, it was not known using $Ir_2O_3$ for p type semiconductors. Recently, the applicants have examined the use of $Ir_2O_3$ as p type semiconductors, and research and development are proceeding.

PRIOR ART DOCUMENT

Patent Document

[Patent Document 1] Japanese Patent Application Laid-Open No. 2005-340308
[Patent Document 2] Japanese Patent Application Laid-Open No. 2013-58637
[Patent Document 3] Japanese Patent Application Laid-Open No. 2016-25256
[Patent Document 4] Japanese Patent Application Laid-Open No. H09-25255
[Patent Document 5] Japanese Patent Application Laid-Open No. H08-227793
[Patent Document 6] Japanese Patent Application Laid-Open No. H11-21687

Non-Patent Document

[Non-Patent Document 1] Kentaro Kinko, "Growth and Physical Properties of Corundum-Structured Gallium Oxide-Based Mixed-Crystal Thin Films," Ph.D., Kyoto University, March 2013
[Non-Patent Document 2] Tatsuya Takemoto, EE Times Japan, "Power-Semiconductor Gallium Oxide" Thermal Conductivity, P-Type . . . Problems to be overcome and put into practical use, [online], Feb. 27, 2014, ITIMA CORPORATION, [Search Jun. 21, 2016], Internet <URL: http://eetimes.jp/ee/articles/1402/27/news028_2.html>
[Non-Patent Document 3] F. P. KOFFYBERG et al., "optical bandgaps and electron affinities of semiconducting Rh2O3(I) and Rh2O3(III)", J. Phys. Chem. Solids Vol. 53, No. 10, pp. 1285-1288, 1992
[Non-Patent Document 4] Hideo Hosono, "Functional Development of Oxide Semiconductors," Physical Properties Research and Electronic Version Vol. 3, No. 1, 031211 (November 2013-February 2014 Merger)

SUMMARY OF THE DISCLOSURE

Technical Problem

An object of the disclosure is to provide a semiconductor apparatus capable of reducing the leakage current in the reverse direction, and keeping a semiconductor characteristics and realizing excellent semiconductor properties even when using n type semiconductor (gallium oxide, for example) or the like having a low-loss at a high voltage and having much higher dielectric breakdown electric field strength than SiC.

Solution to Problem

The inventors have intensively studied in order to achieve the above object, succeeded in creating a crystalline p type oxide semiconductor film, and such a p type oxide semiconductor film found that can be used in the electric field shield layer, also by embedding the electric field shield layer in the n type semiconductor layer deeper than the gate electrode. Further, it is possible to reduce the leakage current in the reverse direction, and an n type semiconductor (gallium oxide, for example) or the like having a low-loss at a high voltage and having much higher dielectric breakdown electric field strength than SiC without impairing the semiconductor properties, found that excellent semiconductor apparatus can be obtained, the semiconductor apparatus having such a structure can solve the problems described above.

In addition, the inventors have further studied after the above-mentioned findings was obtained, thereby completing the disclosure. That is, the disclosure relates to the followings.

[1] A semiconductor apparatus including an n type semiconductor layer including a crystalline oxide semiconductor having a corundum structure as a main component, and an electric field shield layer and a gate electrode that are respectively laminated directly or through other layers on the n type semiconductor layer, wherein the electric field shield layer includes a p type oxide semiconductor, and is embedded in the n type semiconductor layer deeper than the gate electrode.

[2] The semiconductor apparatus according to [1], wherein the p type oxide semiconductor includes a metal oxide containing a d-block metal of the periodic table or a metal belonging to Group 13 of the periodic table.

[3] The semiconductor apparatus according to [1] or [2], wherein the p type oxide semiconductor includes a metal oxide containing a metal of Group 9 or Group 13 of the periodic table.

[4] The semiconductor apparatus according to any one of [1] to [3], wherein the n type semiconductor layer contains an oxide semiconductor containing a Group 13 metal as a main component.

[5] The semiconductor apparatus according to any one of [1] to [4], wherein the semiconductor apparatus includes an insulated gate type semiconductor device or a Schottky gate.

[6] The semiconductor apparatus according to any one of [1] to [5], further including a Schottky barrier structure.

[7] The semiconductor apparatus according to any one of [1] to [6], wherein the semiconductor apparatus includes a power device.

[8] The semiconductor apparatus according to any of [1] to [7], wherein the semiconductor apparatus includes a power module, an inverter, or a converter.

[9] A semiconductor system comprising a semiconductor apparatus, wherein the semiconductor apparatus is a semiconductor apparatus according to any of the [1] to [8].

Advantageous Effect

The disclosure can realize an excellent semiconductor apparatus capable of reducing the leakage current in the reverse direction, and keeping characteristics thereof, even when using n type semiconductor (gallium oxide, for example) or the like having a low-loss at a high voltage and having much higher dielectric breakdown electric field strength than SiC.

BRIEF DESCRIPTION OF THE DRAWINGS

FIG. 6A illustrates the observation results of the cross-sectional SEM of the reference example, and FIG. 6B illustrates the observation results of the cross-sectional SEM of the comparative reference example.

DESCRIPTION OF EMBODIMENTS

Figure 1:
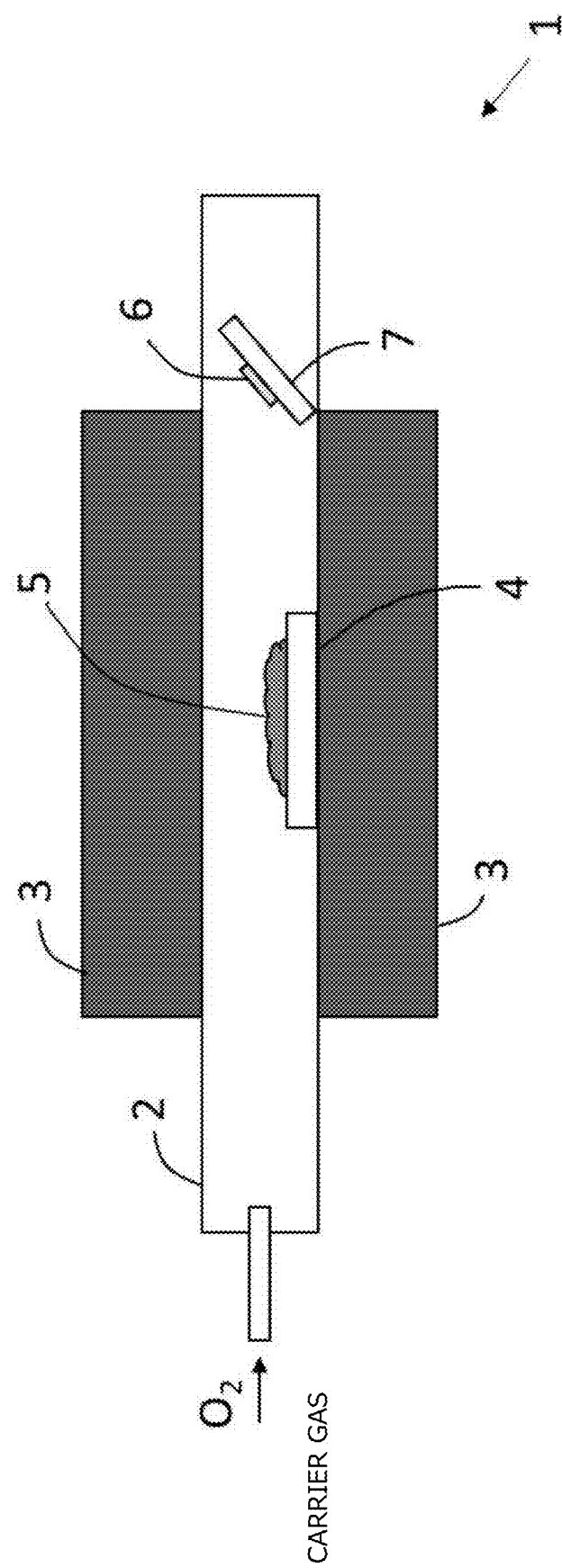
FIG. 1 is a schematic configuration diagram illustrating a deposition apparatus used in a reference example.

Hereinafter, preferred embodiments of the disclosure will be described.

Semiconductor apparatus of the disclosure includes an n type semiconductor layer including a crystalline oxide semiconductor having a corundum structure as a main component, a semiconductor apparatus including at least an electric field shield layer and a gate electrode which are respectively laminated directly or through other layers on the n type semiconductor layer, the electric field shield layer includes a p type oxide semiconductor, wherein the electric field shield layer is embedded in the n type semiconductor layer deeper than the gate electrode.

The material of the gate electrode is not particularly limited as long as it can be used as a gate electrode, and may be a conductive inorganic material or a conductive organic material. In the disclosure, it is preferable that the material of the gate electrode is metal. Examples of the metal include at least one metal selected from Groups 4 to 11 of the periodic table. Examples of the metal of Group 4 of the periodic table include titanium (Ti), zirconium (Zr) and hafnium (Hf), among which Ti is preferable. Examples of the metal of Group 5 of the periodic table include vanadium (V), niobium (Nb) and tantalum (Ta). Examples of the metal of Group 6 of the periodic table include one or more metals selected from chromium (Cr), molybdenum (Mo) and tungsten (W), and in the disclosure, Cr is preferable because the semiconductor characteristics such as switching characteristics are more favorable. Examples of the metal of Group 7 of the periodic table include manganese (Mn), technetium (Tc) and rhenium (Re). Examples of the metal of Group 8 of the periodic table include iron (Fe), ruthenium (Ru) and osmium (Os). Examples of the metal of Group 9 of the periodic table include cobalt (Co), rhodium (Rh) and iridium (Ir). Examples of the metal of Group 10 of the periodic table include nickel (Ni), palladium (Pd) and platinum (Pt), among which Pt is preferable. Examples of the metal of Group 11 of the periodic table include copper (Cu), silver (Ag) and gold (Au).

As the means for forming the gate electrode, some known methods or the like, and more specifically, a dry method, a wet method can be applied. Examples of the dry method include known methods such as sputtering, vacuum evaporation and CVD. Examples of the wet method include screen printing and die coating.

In the disclosure, a p type oxide semiconductor is used in the electric field shield layer. In the disclosure, the p type oxide semiconductor may be a single crystal, a polycrystal, or the like. The p type oxide semiconductor usually contains a metal oxide, and the metal oxide preferably contains a d-block metal of the periodic table or a metal of Group 13 of the periodic table, and more preferably contains a metal of Group 9 of the periodic table or a metal of Group 13 of the periodic table. In the disclosure, it is preferable that the p type oxide semiconductor contains a crystal or mixed crystal of a metal oxide containing iridium or gallium. Although "iridium- or gallium-containing metal dioxide" includes an iridium element or gallium element and oxygen, it is preferably $Ir_2O_3$ or $Ga_2O_3$, and it is preferably alpha-$Ir_2O_3$ or alpha-$Ga_2O_3$ in the disclosure. Note that in the case where the p type oxide semiconductor contains a mixed crystal of a metal oxide containing iridium, it is also preferable that the p type oxide semiconductor be a mixed crystal containing iridium and a Group 2 metal of the periodic table, a Group 9 metal other than iridium, or a Group 13 metal. According to the above preferable semiconductor, a band gap of 2.4 eV or more can be obtained, so that a wider band gap and more excellent electric characteristics can be exhibited in the p type oxide semiconductor. In the disclosure, the band gap of the p type oxide semiconductor is preferably 2.0 eV or more. In the disclosure, the electric field shield layer may include a part of or all the channel layer.

In the disclosure, it is also preferable that the p type oxide semiconductor contains a crystal or a mixed crystal of a metal oxide containing gallium. In this case, the p type oxide semiconductor usually contains a p type dopant. The p type dopant is not particularly limited, and examples thereof include Mg, Zn, Ca, H, Li, Na, K, Rb, Cs, Fr, Be, Sr, Ba, Ra, Mn, Fe, Co, Ni, Pd, Cu, Ag, Au, Cd, Hg, Tl, Pb, N, P, and two or more of these elements. Also, the density of the dopant may be approximately $1\times10^{16}/cm^3 \sim 1\times10^{22}/cm^3$, or the density of the dopant may be lower such as $1\times10^{17}/cm^3$ or less. Further, in the disclosure, the dopant may be contained in a high density of about $1\times10^{20}/cm^3$ or more.

In the above description, the term "periodic table" means the periodic table defined by the International Union for Pure and Applied Chemistry (IUPAC). Further, "d-block" refers to an element having electrons that fill 3d, 4d, 5d and 6d orbital. As the d-block metal, Scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au), mercury (Hg), lawrencium (Lr), rutherfordium (Rf), dubnium (Db), seaborgium (Sg), bohrium (Bh), hassium (Hs), meitnerium (Mt), darmstadtium (Ds), Roentgenium (Rg), copernicium (Cn) and two or more of these metals may be specified for example.

The "Group 2 metal" may be any metal of Group 2 of the periodic table, and examples of the Group 2 metal include beryllium (Be), magnesium (Mg), calcium (Ca), strontium (Sr), barium (Ba), or two or more of these metals. The "Group 9 metal" may be any metal of Group 9 of the periodic table, including, for example, iridium (Ir), cobalt (Co), rhodium (Rh), or two or more of these metals. The "Group 13 metal" may be any metal of Group 13 of the periodic table, including, for example, aluminum (Al), gallium (Ga), indium (In), thallium (Tl), or two or more of these metals. In the disclosure, one or two or more metals selected from aluminum (Al), gallium (Ga) and indium (In) are preferable.

The p type oxide semiconductor may have crystallinity or may be amorphous, but in the disclosure, it is preferable that the p type oxide semiconductor can be a crystalline oxide semiconductor. The crystalline oxide semiconductor may be single crystal or polycrystal, but single crystal is preferable. Examples of the crystal structure of the crystalline oxide semiconductor include a corundum structure, a β-gallia structure, an ε-type crystal structure, and in the disclosure, it is preferable to have a corundum structure.

As a preferable method of forming the p-type oxide semiconductor included in the electric field shield layer, for example, crystal growth is performed on a substrate by thermal reaction using a metal oxide gas as a raw material, and more specifically, for example, a solid substance (powder or the like) of the metal oxide gas is sublimed (sublimation step) and then crystal growth is performed on a substrate (crystal growth step) using a deposition apparatus shown in FIG. 1.

Hereinafter, an example of depositing a p type oxide semiconductor included in the electric field shield layer will be described in more detail of the disclosure.

(Sublimation Step)

In the sublimation step, a solid substance of the metal oxide gas (powder, for example) is sublimed to form a gaseous state, thereby obtaining a metal oxide gas. Examples of the metal oxide gas include metal oxides of metals contained in the gaseous p type oxide semiconductor film, but the valence and the like of the metal oxides are not particularly limited and may be monovalent, divalent, trivalent or tetravalent as long as they do not deviate the object of the disclosure. In the embodiment, a $IrO_2$ gas is preferably used as the metal oxide gas when the p type oxide semiconductor film includes a metal oxide containing iridium as a main component. Examples of the sublimation means include heating means. The heating temperature is not particularly limited, but is preferably 600° C. to 1200° C., and more preferably 800° C. to 1000° C. In the disclosure, it is preferable that the metal oxide gas obtained by sublimation is transported to the substrate by a carrier gas. The type of the carrier gas is not particularly limited as long as it does not deviate the object of the disclosure. Examples of the carrier gas include an inert gas such as oxygen, ozone, nitrogen, or argon, or a reducing gas such as a hydrogen gas or a forming gas. In the disclosure, it is preferable to use oxygen as the carrier gas. Examples of the carrier gas in which oxygen is used include air, oxygen gas and ozone gas, and particularly, oxygen gas and/or ozone gas are preferable. In addition, the type of the carrier gas may be one type, but may be two or more types. A dilution gas in which concentration of the carrier gas changes (a 10-fold dilution gas, for example) may be further used as the second carrier gas. The carrier gas may be supplied not only at one point but also at two or more points. The flow rate of the carrier gas is not particularly limited, but is preferably 0.01 to 20 L/min, more preferably 0.1 to 10 L/min.

The substrate is not particularly limited as long as it can support the p type oxide semiconductor. The material of the substrate is not particularly limited as long as it does not deviate the object of the disclosure, and may be a known substrate, an organic compound, or an inorganic compound. The shape of the substrate may be any shape, and the substrate performs effectively for any shape. Examples of the shape include plate-like such as a flat plate or a disc, fiber-like, rod-like, columnar, prismatic, cylindrical, spiral, spherical, ring-like, and in the disclosure, a plate-like substrate is preferable. The thickness of the substrate is not particularly limited in the disclosure.

The substrate is not particularly limited as long as it has a plate shape and serves as a support for the p type oxide semiconductor. The substrate may be an insulator substrate, a semiconductor substrate or a conductive substrate, however, it is preferable that the substrate is an insulator substrate. It is also preferable that the substrate has a metal film on its surface. The substrate preferably has a corundum structure, for example. The substrate material is not particularly limited as long as it does not deviate the object of the disclosure, and may be a known material. As the substrate having the corundum structure, for example, a base substrate having a substrate material having the corundum structure as a main component can be selected, and more specifically, for example, a sapphire substrate (preferably a c-plane sapphire substrate) or an α-type gallium oxide substrate can be selected. Here, the "main component" means that the substrate material having the specific crystal structure is contained in an atomic ratio of preferably 50% or more, further preferably 70% or more, and yet further preferably 90% or more with respect to all components of the substrate material, and can be 100%.

(Crystal Growth Step)

In the crystal growth step, the metal oxide gas is crystal-grown in the vicinity of the substrate surface to deposit on part of or all the substrate surface. The crystal growth temperature is preferably lower than the heating temperature of the sublimation step, more preferably 900° C. or less, and most preferably 500° C. to 900° C. The crystal growth may be performed under any of a vacuum, a non-oxygen atmosphere, a reducing gas atmosphere, and an oxidizing atmosphere, and may be performed under any of atmospheric pressure, pressure, and reduced pressure as long as the object of the disclosure is not deviated, but in the disclosure, it is preferable to perform under an oxidizing atmosphere, preferably under atmospheric pressure, and more preferably under an oxidizing atmosphere and at atmospheric pressure. Note that the "oxidizing atmosphere" is not particularly limited as long as it is an atmosphere in which crystals or mixed crystals of a metal oxide can be formed. For example, an oxidizing atmosphere can be obtained by using a carrier gas containing oxygen or an oxidizing agent. The film thickness can be set by adjusting the deposition time, and in the disclosure, the film thickness is preferably 1 nm to 1 mm, more preferably 1 nm to 100 µm from the perspective of improvement of the semiconductor characteristics, and most preferably 1 nm to 10 µm.

In the disclosure, deposition can be made directly on the substrate. However, it may be possible to deposit on the substrate via another layer after laminating the another layer different from the p type semiconductor layer (n type semiconductor layer, n+ type semiconductor layer, n− type semiconductor layer, for example), an insulator layer (including a semi-insulator layer) or a buffer layer. As the semiconductor layer and the insulator layer, a semiconductor layer and an insulator layer including the group 13 metal, for example. As the buffer layer, a semiconductor layer including a corundum structure, an insulator layer or a conductor layer, for example, are preferably selected. Semiconductor layers including the corundum structure described above include, $\alpha\text{-Fe}_2\text{O}_3$, $\alpha\text{-Ga}_2\text{O}_3$ and $\alpha\text{-Al}_2\text{O}_3$, for example. The means for laminating the buffer layer is not particularly limited, and may be the same as the means for forming the p-type oxide semiconductor.

The n type semiconductor layer is not particularly limited as long as it contains a crystalline oxide semiconductor having a corundum structure as a main component. In the disclosure, the n type semiconductor layer preferably contains a crystalline oxide semiconductor containing a metal of Group 13 of the periodic table (Al, Ga, In and Tl, for example) as a main component, and more preferably contains a crystal of a metal oxide containing gallium or a mixed crystal thereof as a main component. The crystalline oxide semiconductor which is a main component of the n type semiconductor layer may be single crystal or polycrystal, and is preferably single crystal. In the disclosure, it is preferable to form an n type semiconductor layer before or after the deposition of the p type semiconductor layer. More specifically, in the method of manufacturing a semiconductor apparatus, it is preferable to include a step of laminating at least a p type semiconductor layer and an n type semiconductor layer. The means for forming the n-type semiconductor layer is not particularly limited and may be a known means, but in the disclosure, a mist CVD method is preferable.

In the disclosure, it is preferable that the semiconductor apparatus further includes a channel layer. The channel layer is not particularly limited as long as a channel is formed, and may have n type conductivity or p type conductivity, but in the disclosure, part of or whole the channel layer preferably contains the p type oxide semiconductor. The thickness of the channel layer is not particularly limited, but is preferably 0.1 µm to 5.0 µm, more preferably 0.2 µm to 2.0 µm. The p type oxide semiconductor preferably used for the channel layer may be the same as the p type oxide semiconductor included in the electric field shield layer, or may have a composition different from that of the p type oxide semiconductor included in the electric field shield layer. The means for forming the channel layer may be a known means, but in the disclosure, it is preferable that the means for forming the electric field shield layer is the same as the means for forming the electric field shield layer. The channel layer may be a single layer or a multilayer.

In the disclosure, the channel layer may further include an n type oxide semiconductor. The n type oxide semiconductor is not particularly limited, but in the disclosure, it preferably contains a metal of Group 13 of the periodic table (Al, Ga, In and Tl, for example), and more preferably contains Ga. The n type semiconductor layer preferably contains a crystalline oxide semiconductor as a main component, more preferably contains a crystalline oxide semiconductor having a corundum structure or a hexagonal crystal structure as a main component, and most preferably having a corundum structure as a main component. Note that the term "main component" means that the crystalline oxide semiconductor contains preferably 50% or more, further preferably 70% or more, and yet further preferably 90% or more of all the components of the n type semiconductor layer in atomic ratio, and can be 100%.

Another preferable method for forming a p type oxide semiconductor included in the electric field shield layer will be described. Another suitable means for forming the p type oxide semiconductor includes, a means for depositing a film by a mist CVD method using a raw material solution containing a metal, a p type dopant, and hydrobromic acid, for example, and more specifically, a raw material solution containing a metal, a p type dopant, and hydrobromic acid is atomized or formed into droplets (atomization and droplet formation step), the obtained mist or droplet is conveyed onto a substrate by a carrier gas (conveying step), and then a semiconductor film containing a crystalline oxide semiconductor as a main component is laminated on the substrate (deposition step) by thermally reacting the mist or the droplets in a deposition chamber.

Hereinafter, the disclosure will be described in more detail with reference to suitable examples of depositing a p type oxide semiconductor contained in the electric field shield layer.

(Atomization and Droplet Formation Step)

In the atomization and droplet formation step, the raw material solution is atomized or formed into droplets. The atomizing means or the droplet forming means of the raw material solution is not particularly limited as long as it can atomize or form droplet of the raw material solution, and may be a known means. In the disclosure, an atomizing means or a droplet forming means using ultrasonic waves is preferable. The mist or droplet obtained using ultrasonic waves is preferable because its initial velocity is zero and is suspended in the air. Because the mist is not injected like a spray, for example, but is capable of being suspended in a space and conveyed as a gas, and therefore, there is no damage due to collision energy, and it is highly preferable. The droplet size is not particularly limited, but is preferably 50 µm or less, more preferably 100 nm to 10 µm.

(Raw Material Solution)

The raw material solution is not particularly limited as long as it can be atomized or droplets and contains metal, p type dopant and hydrobromic acid, and may be an inorganic material or an organic material. In the disclosure, the raw material is preferably a metal or a metal compound, and more preferably contains one or more metals selected from gallium, iron, indium, aluminum, vanadium, titanium, chromium, rhodium, nickel, cobalt, zinc, magnesium, calcium, silicon, yttrium, strontium and barium.

In the disclosure, a solution obtained by dissolving or dispersing the metal in the form of a complex or a salt in an organic solvent or water can be suitably used as the raw material solution. Examples of the form of the complex include an acetylacetonate complex, a carbonyl complex, an ammine complex, and a hydride complex. Examples of the salt forms include, for example, organometallic salts (such as metal acetate, metal oxalate and metal citrate), metal sulfide salts, nitride metal salts, phosphorylated metal salts and metal halide salts (such as metal chloride salts, metal bromide salts and metal iodide salts).

The p type dopant is not particularly limited as long as it does not deviate the object of the disclosure. As the p type dopant, Mg, Zn, Ca, H, Li, Na, K, Rb, Cs, Fr, Be, Sr, Ba, Ra, Mn, Fe, Co, Ni, Pd, Cu, Ag, Au, Cd, Hg, Tl, Pb, N, P, for example, and an element of two or more of these, can be selected.

The solvent of the raw material solution is not particularly limited, and may be an inorganic solvent such as water, an organic solvent such as alcohol, or a mixed solvent of the inorganic solvent and the organic solvent. In the disclosure, it is preferable that the solvent contains water, and it is more preferable that the solvent is water or a mixed solvent of water and alcohol.

Further, an additive such as an oxidizing agent may be mixed with the raw material solution. Examples of the oxidizing agent include peroxide such as hydrogen peroxide ($H_2O_2$), sodium peroxide ($Na_2O_2$), barium peroxide ($BaO_2$), benzoyl peroxide ($(C_6H_5CO)_2O_2$), and organic peroxide such as hypochlorous acid (HClO), perchloric acid, nitric acid, ozone water, peracetic acid and nitrobenzene, for example.

(Conveying Step)

In the conveying step, the mist or the droplet is conveyed into the deposition chamber using a carrier gas. The carrier gas is not particularly limited as long as it does not deviate the object of the disclosure, an inert gas such as oxygen, ozone, nitrogen, or argon, or a reducing gas such as hydrogen gas or forming gas can be used as a suitable example. In addition, the type of the carrier gas may be one type, but two or more types may be used, and a dilution gas or the like having a reduced flow rate (a 10-fold dilution gas, for example) may be additionally used as the second carrier gas. The carrier gas may be supplied not only at one point but also at two or more points. The flow rate of the carrier gas is not particularly limited, but is preferably 0.01 to 20 L/min, more preferably 1 to 10 L/min. For the diluent gas, the flow rate of the diluent gas is preferably 0.001 to 2 L/min, more preferably from 0.1 to 1 L/min.

(Deposition Step)

In the deposition step, the semiconductor film is deposited on the substrate by thermally reacting the mist or the droplet in the deposition chamber. The thermal reaction may be any reaction as long as the mist or the substrate reacts with heat, and the reaction conditions and the like are not particularly limited as long as they do not deviate the object of the disclosure. In this step, the thermal reaction is usually carried out at a temperature equal to or higher than the evaporation temperature of the solvent, but a temperature not excessively high (for example, 1000° C.) or lower is preferable, 650° C. or lower is more preferable, and 300° C. to 650° C. is most preferable. As long as the object of the disclosure is not deviated, the thermal reaction may be performed under any of a vacuum, a non-oxygen atmosphere, a reducing gas atmosphere, and an oxygen atmosphere, and is preferably performed under a non-oxygen atmosphere or an oxygen atmosphere. The step may be carried out under any of the conditions of atmospheric pressure, pressure or reduced pressure, and in the disclosure, it is preferably carried out under atmospheric pressure. The film thickness can be set by adjusting the deposition time.

The substrate used in the deposition of the p type oxide semiconductor using mist CVD described above may be the same as the substrate used in the deposition of the p type oxide semiconductor using the metal oxide gas.

The semiconductor apparatus of the disclosure typically includes a source electrode (Schottky electrode) and a drain electrode. Known electrode materials may be used for the source electrode (Schottky electrode) and the drain electrode as long as they do not deviate the object of the disclosure, and preferably contain a metal of Group 4 or Group 11 of the periodic table. Preferred metals of Group 4 or Group 11 of the periodic table used for the source electrode (Schottky electrode) and the drain electrode may be the same as the metals contained in the gate electrode. Further, the source electrode (Schottky electrode) and the drain electrode may be a single layer of metal or may include two or more metal layers. The means for forming the source electrode (Schottky electrode) and the drain electrode is not particularly limited, and known means such as a vacuum evaporation method and a sputtering method may be used. The metal constituting the source electrode and the drain electrode may be an alloy, for example.

Further, in the disclosure, the semiconductor device further including a Schottky barrier structure is preferable, because it can reduce the on-voltage and provide to flow a free-wheel current easily. Further, in this case, the Schottky junction surface in the Schottky barrier structure may be flush with the bottom surface of the gate electrode, may be provided above the bottom surface of the gate electrode, or may be provided below. According to the disclosure, even when the semiconductor apparatus includes a Schottky barrier structure, the electric field intensity applied to the Schottky interface is reduced and the leakage current in the reverse direction is reduced.

Hereinafter, preferred embodiments of the disclosure will be described in more detail with reference to the drawings and the like, but the disclosure is not limited to these embodiments.

Figure 10:
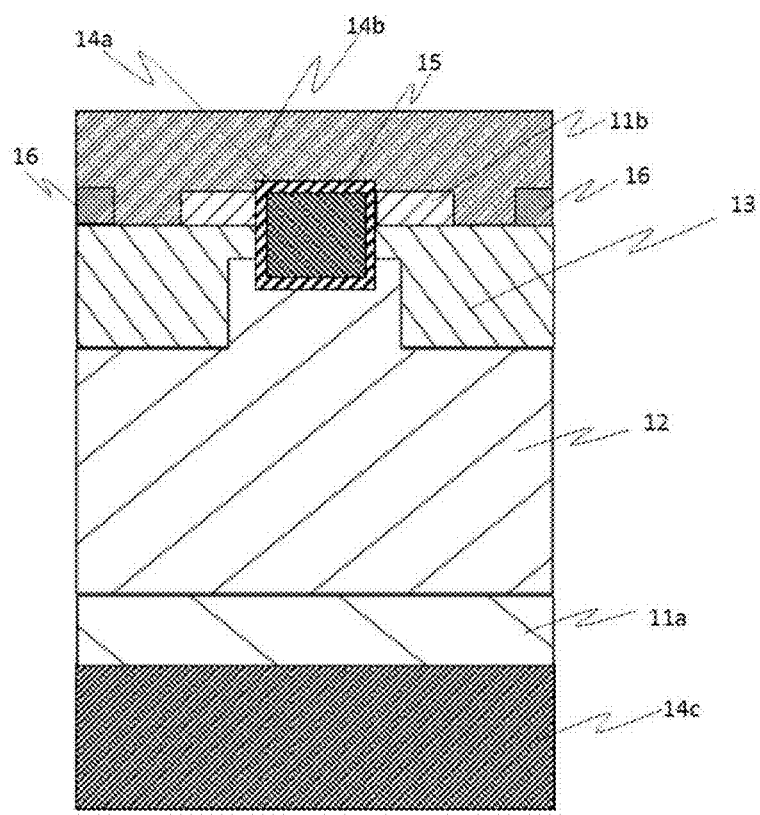
FIG. 10 is a schematic diagram illustrating an example of a metal-oxide-semiconductor field-effect transistor (MOSFET).
Figure 11A:
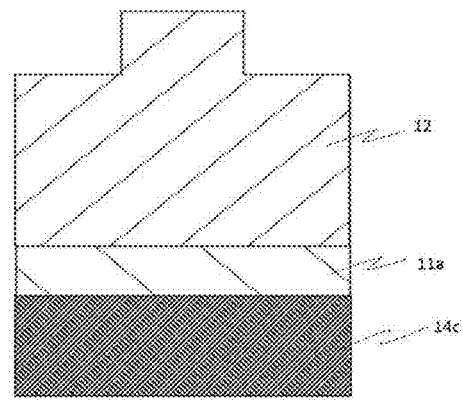
FIG. 11 is a schematic diagram illustrating a preferred example of a semiconductor apparatus incorporating SBDs in the metal oxide semiconductor field-effect transistor (MOSFET).
Figure 11B:
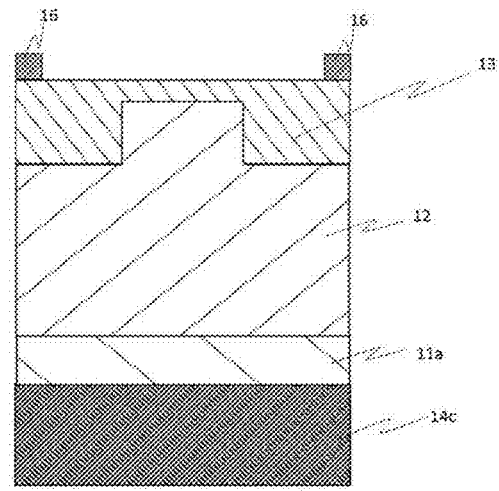
Figure 11C:
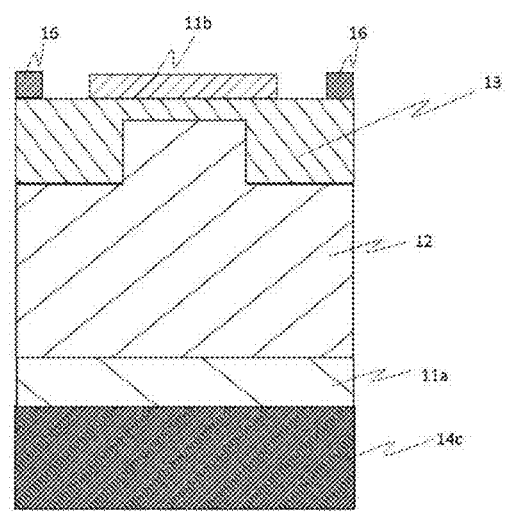

FIG. 10 shows a semiconductor apparatus suitable for the disclosure. The semiconductor apparatus illustrated in FIG. 10 includes a first n+ type semiconductor layer 11a, an n− type semiconductor layer 12, a p type semiconductor layer 13, a second n+ type semiconductor layer 11b, a p+ type semiconductor layer 16, a gate electrode 14a, a gate insulating film 15, a Schottky electrode 14b and a drain electrode 14c. In the on-state of the semiconductor apparatus of FIG. 10, when a voltage is applied between the source electrode 14b and the drain electrode 14c, and a charge positive to the source electrode 14b is applied to the gate electrode 14a, the channel is formed at the interface of the p type semiconductor layer 13 and the gate insulating film 14a, thereby it turns on. In the off-state, by turning the voltage of the gate electrode 14a to 0V, it turns off. Further, in the semiconductor apparatus of FIG. 10, the electric field shield layer 13 is embedded in the n− type semiconductor layer 12 deeper than the gate electrode 14a. With such a configuration, it is possible to reduce the leakage current in the reverse direction by reducing electric field intensity applied to the p+ type semiconductor layer and the gate insulating layer, and improve the withstand voltage. In the disclosure, it is preferable that the p type semiconductor layer 13 includes a crystal or mixed crystal of a metal oxide containing gallium, and the p+ type semiconductor layer 16 includes a crystal or mixed crystal of a metal oxide containing iridium, because the above-described semiconductor characteristics of the semiconductor apparatus can be achieved favorably. Further, using a p type oxide semiconductor containing a crystal or mixed crystal of a metal oxide containing gallium, in the region where at least the channel is formed among the p type semiconductor layer 13, and also using a p type oxide semiconductor containing a crystal or mixed crystal of a metal oxide containing iridium in the region in contact with the n− type semiconductor layer 12, it is preferable because it makes the depletion layer easily to be elongated to the side of the n− type semiconductor layer, and makes possible to have excellent structure especially in withstand pressure.

The means for forming each layer of the semiconductor apparatus of FIG. 10 is not particularly limited as long as it does not deviate the object of the disclosure, and may be a known means. For example, means for patterning by a photolithography method or means for performing direct patterning using a printing technique or the like may be applied after deposition by a vacuum deposition method, CVD method, a sputtering method or various coating techniques.

Figure 12A:
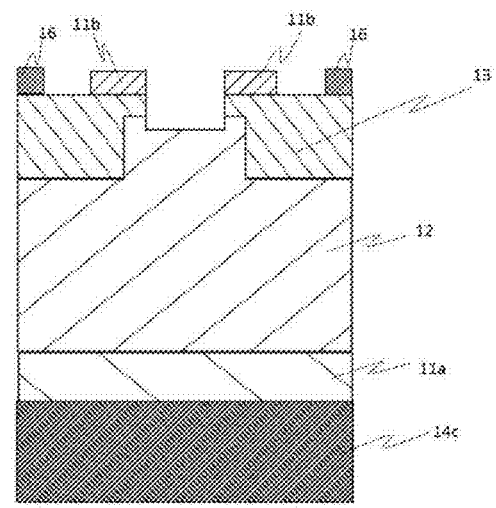
FIG. 12 is a diagram illustrating a preferred manufacturing method of the metal-oxide-semiconductor field-effect transistor (MOSFET) of FIG. 10.
Figure 12B:
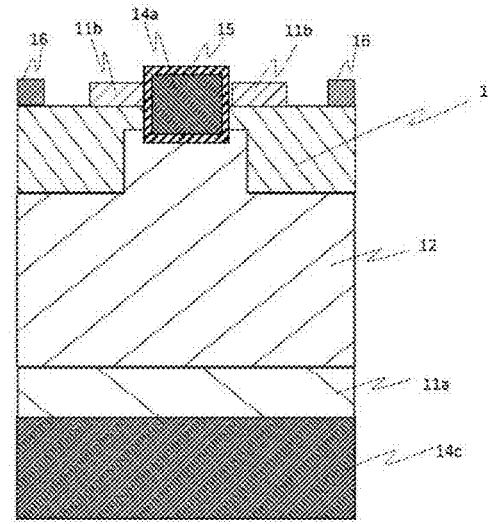

A preferable manufacturing process and the like of the semiconductor apparatus of FIG. 10 will be described with reference to FIGS. 12 and 13. FIG. 12A shows a laminated body in which the drain electrode 14c is laminated on the first n+ type semiconductor layer 11a and the n− type semiconductor layer 12, and a source trench is formed thereto. On the n− type semiconductor layer 12 of the laminated body of FIG. 12A, the p type semiconductor layer 13 is formed, and further to pattern the p+ type semiconductor layer 16 on the p type semiconductor layer 13 to obtain a laminated body of FIG. 12B. Then, by patterning the second n+ type semiconductor layer 11b on the p type semiconductor layer 13 of FIG. 12B, a laminated body of FIG. 12C is obtained.

Figure 12C:
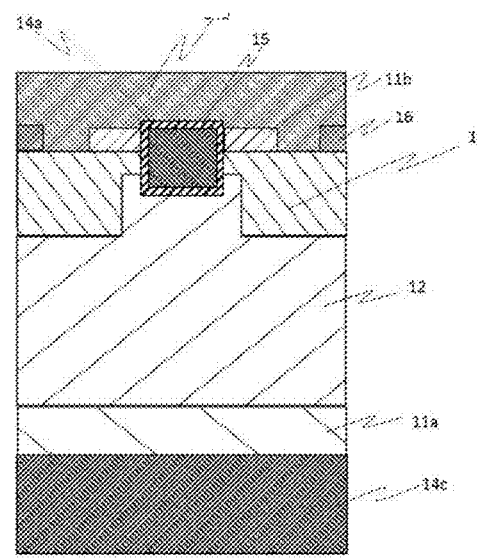
Figure 13:
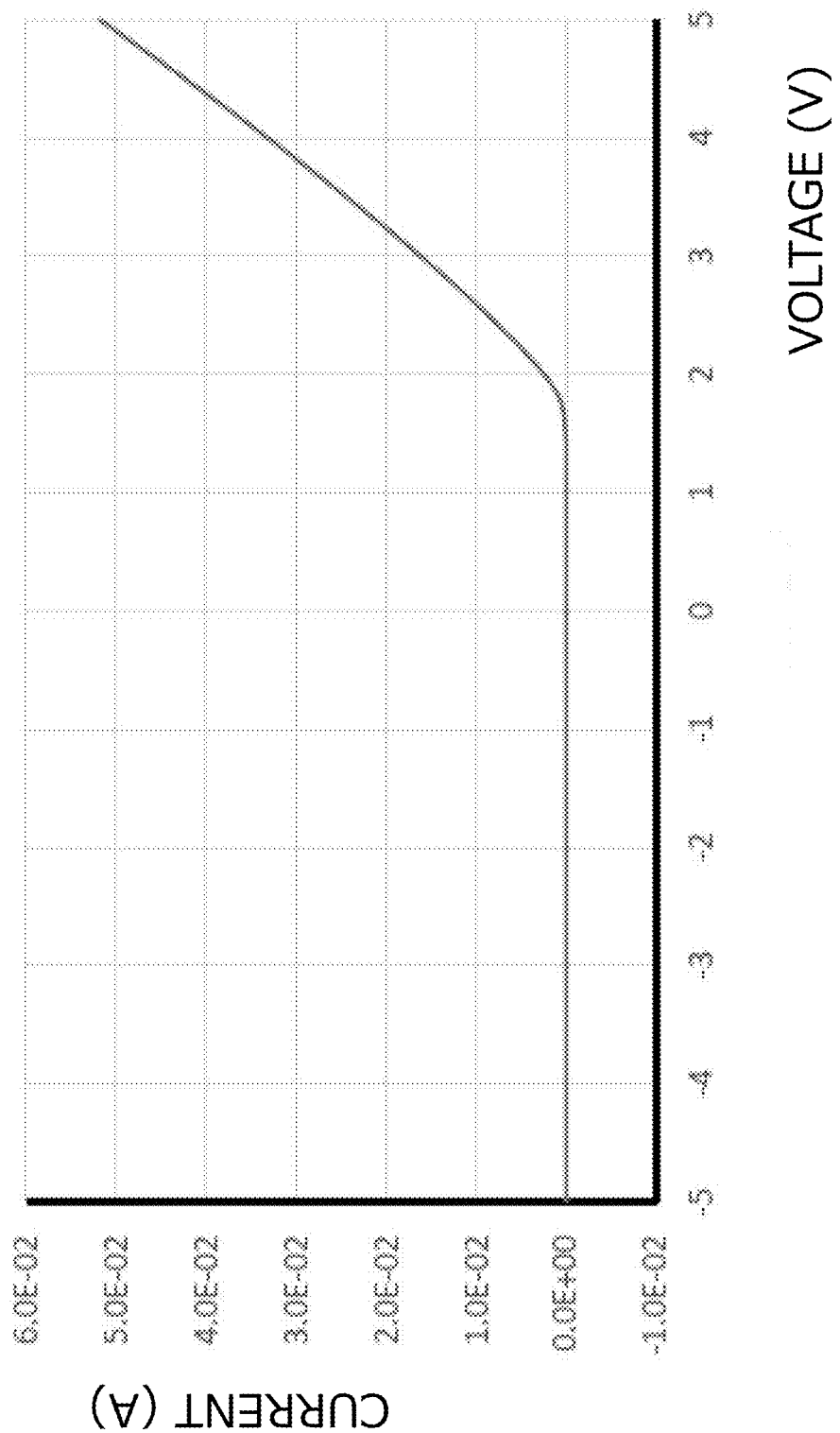
FIG. 13 is a diagram illustrating the results of I-V measurement in the reference example.

After forming the laminated body of FIG. 12C, by performing etching using a photolithography method, the second n+ type semiconductor layer 11b, p type semiconductor layer 13 and the n− type semiconductor layer 12 are partly removed to form a gate trench, as shown in FIG. 13D. Thereafter, by patterning the gate electrode and the gate insulating film covering the gate electrode, to obtain a laminated body of FIG. 13E. The source electrode 14b is formed on the laminated body of FIG. 13E by the dry method (preferably, a vacuum evaporation method or a sputtering method), the wet method, or the like to obtain a laminated body of FIG. 13F.

Although the second n+ type semiconductor layer 11b and the p+ type semiconductor layer 16 are connectedly provided via the source electrode 14b of the semiconductor apparatus of FIG. 10, the second n+ type semiconductor layer 11b and the p+ type semiconductor layer 16 can be directly connected without the source electrode 14b. In the case where the second n+ type semiconductor layer 11b and the p+ type semiconductor layer 16 are directly connected, by providing the p+ type semiconductor layer 16 wider than the second n+ type semiconductor layer 11b, the effect that the "hole pass through" is improved. Further, by providing the second n+ type semiconductor layer 11b wider than the p+ type semiconductor layer 16, an effect of on-state resistance is reduced. Further, in the semiconductor apparatus of FIG. 10, by providing the source electrode 14b formed embedded in the p type semiconductor layer 13, it makes possible to have better insulation breakdown characteristics, due to improved hole pass through during avalanche breakdown.

Such semiconductor apparatus is particularly useful for power devices. As applications of the semiconductor apparatus, a diode or a transistor (MOSFET, JFET and the like) can be considered, and among them, insulated gate type semiconductor apparatus (MOSFET, IGBT and the like) or a semiconductor apparatus having a Schottky gate (MESFET and the like) is preferred, for example, and more preferably MOSFET or IGBT.

Figure 7:
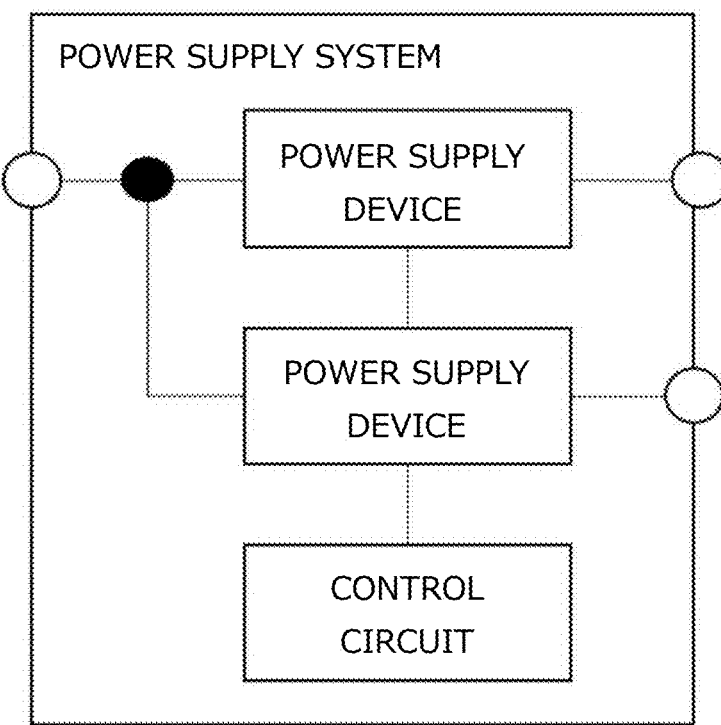
FIG. 7 is a schematic diagram illustrating a suitable example of a power supply system.
Figure 8:
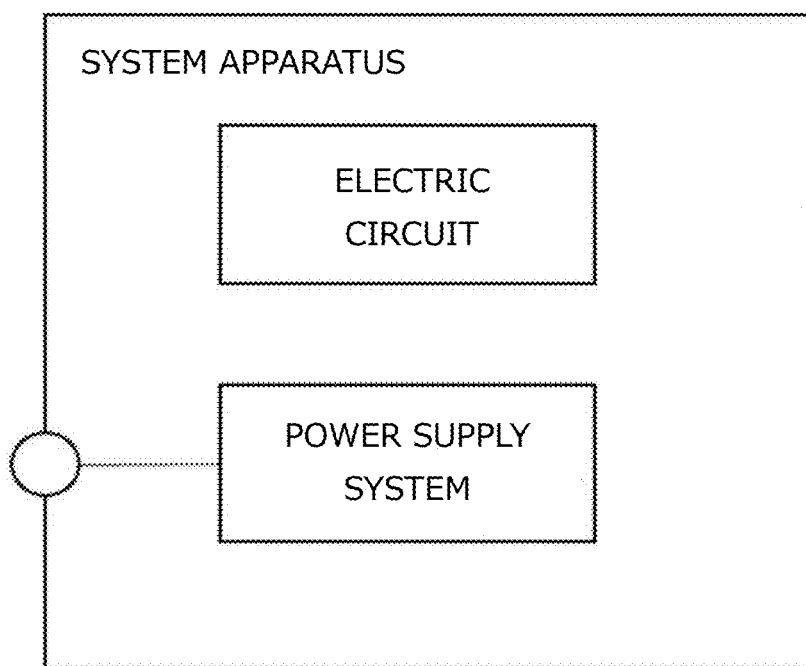
FIG. 8 is a schematic diagram illustrating a suitable example of a system apparatus.
Figure 9:
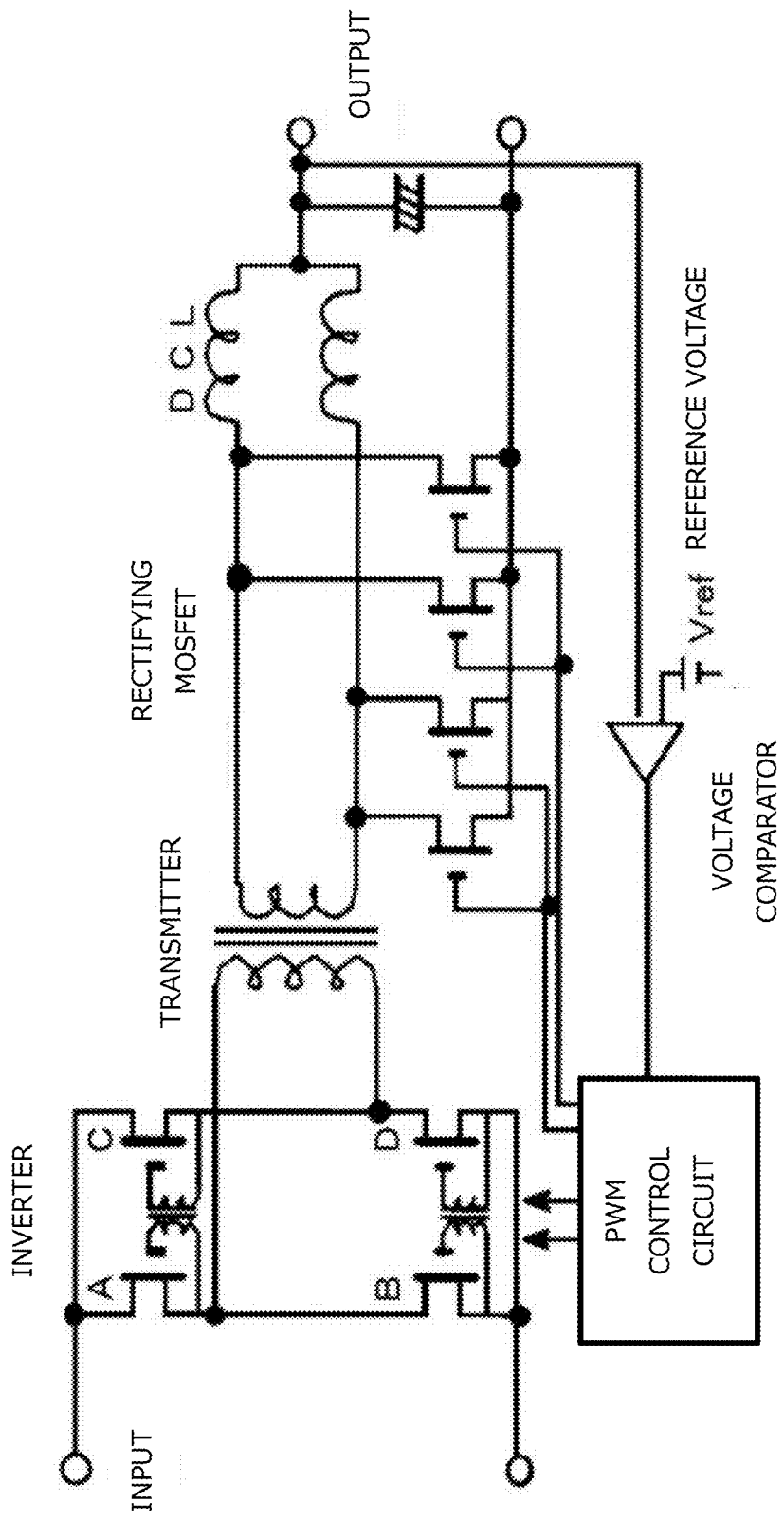
FIG. 9 is a schematic diagram illustrating a suitable example of a power supply circuit diagram of the power supply apparatus.

In addition to the descriptions above, the semiconductor apparatus of the disclosure is suitably used as a power module, such as an inverter or a converter, by using a known technique, and is suitably used in, for example, a semiconductor system using a power supply device. The power supply device can be manufactured by connecting the semiconductor apparatus to a wiring pattern or the like using known technique. FIG. 7 shows an example of a power supply system. FIG. 7 constitutes a power supply system using a plurality of the power supply device and a control circuit. The power supply system can be used in a system device in combination with electronic circuitry, as shown in FIG. 8. An example of a power supply circuit diagram of the power supply is shown in FIG. 9. FIG. 9 shows a power supply circuit of a power supply unit including a power circuit and a control circuit, after switching the DC voltage at a high frequency by an inverter (constituted by MOSFET A to D), insulating and transforming by a transformer is performed, after rectification by a rectifier MOSFET (A to B'), smoothed by a DCL (smoothing coil L1 and L2) and a capacitor, and outputs a DC voltage. At this time, the output voltage is compared with the reference voltage by the voltage comparator, and the inverter and the rectifier MOSFET are controlled by the PWM control circuit to achieve desired output voltage.

Reference Example 1

Figure 3:
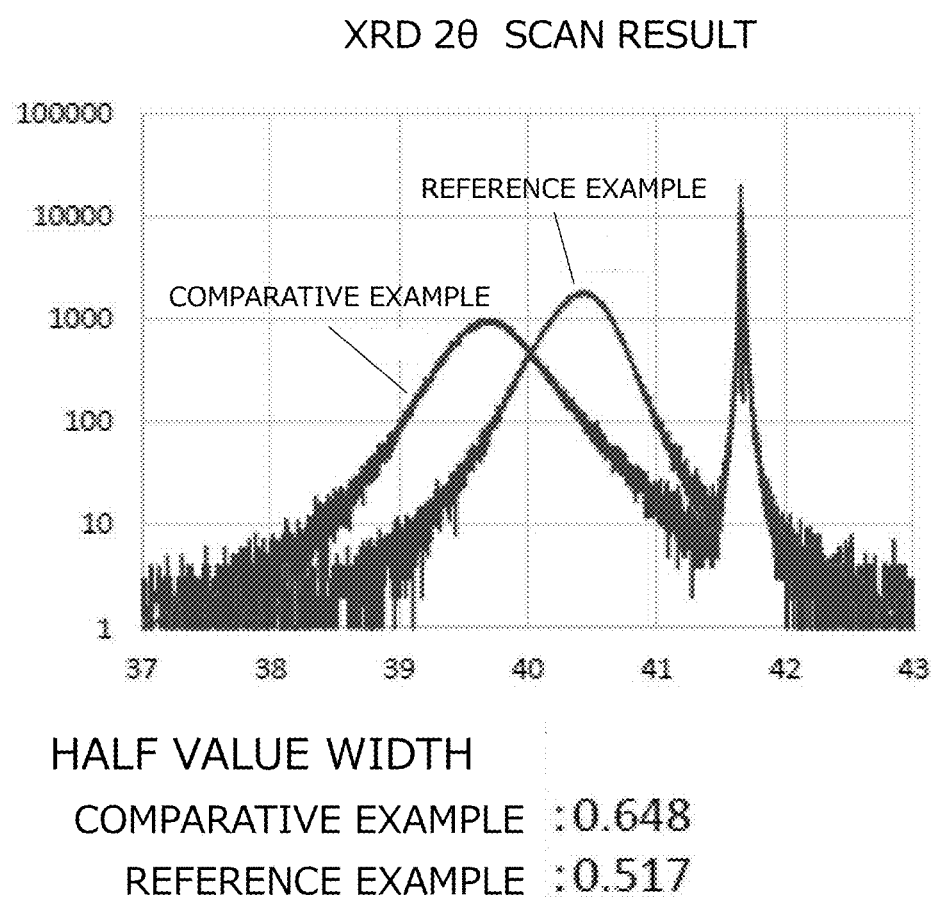
FIG. 3 is a diagram illustrating XRD measurement results in reference examples and comparative reference examples. The horizontal axis shows a diffraction angle (deg.), the vertical axis shows a diffraction intensity (arb. unit).
Figure 4:
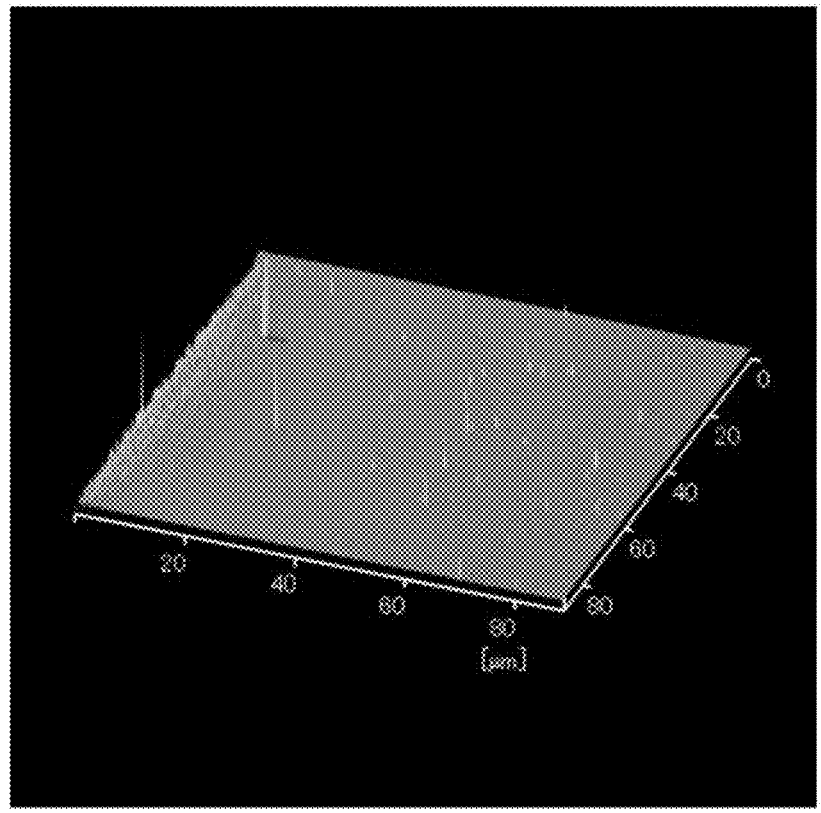
FIG. 4 is a diagram illustrating AFM surface observation results in the reference example.

Hereinafter, a manufacturing example of a p type oxide semiconductor film which is preferably used in the disclosure will be described.
1. Deposition Apparatus
A deposition apparatus used in this reference example will be described with reference to FIG. 1. In the deposition apparatus 1 of FIG. 1, a quartz cylinder 2 connected to a carrier gas supply source and a raw material placement table 4 made of quartz are provided in the quartz cylinder 2, and the raw material 5 is mounted on the raw material placement table 4. A heater 3 is provided, in a cylindrical shape, around the quartz cylinder 2, and is configured to heat the raw material 5. Further, inside the area of the quartz cylinder 2 the quartz substrate base is installed as a susceptor 7, and its position is adjusted so that the susceptor 7 is within the crystal growth temperature.
2. Preparation for Deposition
$IrO_2$ powder as a raw material 5 was placed on the raw material placement table 4, and a sapphire substrate as a substrate 6 was placed on the susceptor 7. Next, the temperature of the heater 3 was raised to 850° C., and $IrO_2$ powder placed on the raw material placement table 4 was heated to sublimate $IrO_2$ powder, thereby producing gaseous iridium oxide.
3. Deposition
Next, while maintaining the temperature of the heater 3 at 850° C., a carrier gas was supplied from a carrier gas supply source into the quartz cylinder 2, and the metal oxide gas (gaseous iridium oxide) generated in the process 2 described above was supplied to the substrate 6 through the quartz cylinder 2. Note that the flow rate of the carrier gas was 1.0 L/min, and oxygen was used as the carrier gas. The metal oxide gas reacted in the vicinity of the surface of the substrate 6 at atmospheric pressure, whereby a film was formed on the substrate. The deposition time was 60 minutes, and the film thickness was 220 nm. The substrate temperature at the time of deposition was 600° C.
4. Evaluation
When the film obtained in the process 3 described above was identified using an X-ray diffraction device, the obtained film was an $\alpha$-$Ir_2O_3$ film. The results of XRD are shown in FIG. 3. We measured the hole-effect of the obtained $\alpha$-$Ir_2O_3$ film, and found that the F-value was 0.998 and the carrier type was "p" and the obtained film was a p type semiconductor. The carrier density was $1.05 \times 10^{22}$ (/cm$^3$) and the mobility was 3.12 (cm$^2$/V·s). The carrier density can be easily controlled at $1.0 \times 10^{16}$/cm$^3$ to $1.0 \times 10^{20}$/cm$^3$ by adjusting the type and quantity of dopants or the materials and their content of the mixed crystal.
Further, when the surface of the film was observed using an atomic force microscope (AFM), as shown in FIG. 4, the surface roughness (Ra) was 3.5 nm, and the surface smoothness was excellent. Note that the surface roughness (Ra), using the surface shape measurement results for the area in the size of 90 μm square by atomic force microscopy (AFM), was calculated based on JIS B0601.

Comparative Reference Example 1

Figure 5:
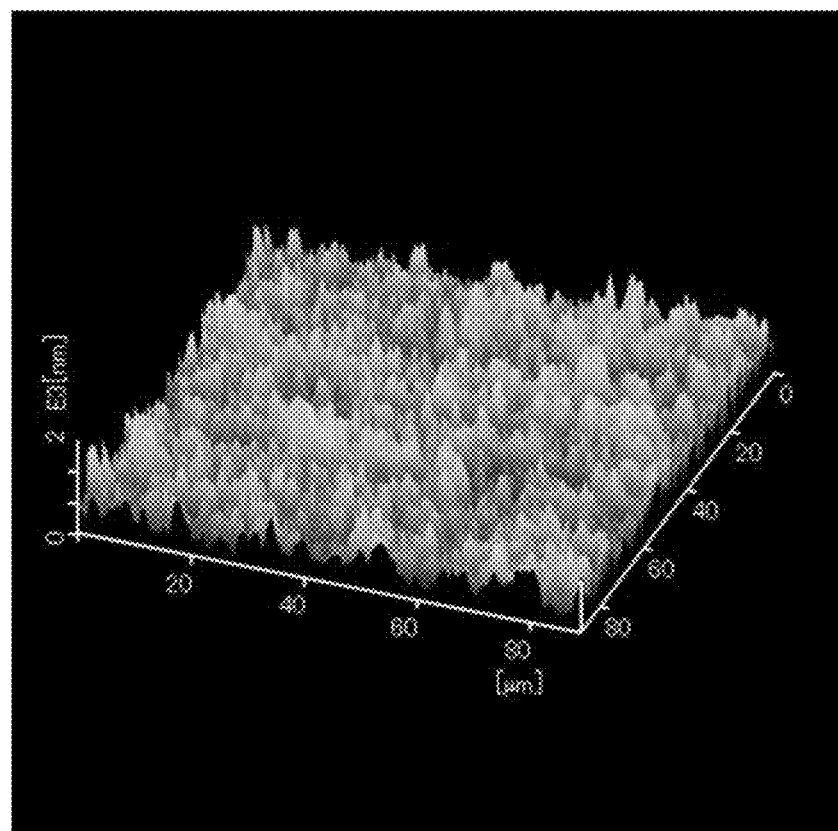
FIG. 5 is a diagram illustrating AFM surface observation results in the comparative reference example.

1. Deposition Apparatus
With reference to FIG. 2, a mist CVD apparatus used in the comparative reference example is explained. Mist CVD apparatus 19 includes a susceptor 21 for placing a substrate 20, a carrier gas supply means 22a for supplying a carrier gas, a flow control valve 23a for adjusting the flow rate of the carrier gas supplied from the carrier gas supply means 22a, a carrier gas (dilution) supply means 22b for supplying a carrier gas (dilution), a flow rate control valve 23b for adjusting the flow rate of the carrier gas supplied from the carrier gas (dilution) supply means 22b, a mist generating source 24 in which the raw material solution 24a is housed, a container 25 in which the water 25a is housed, an ultrasonic vibrator 26 attached to the bottom surface of the container 25, a supply tube 27 made of a quartz tube having an inner diameter of 40 mm, and a heater 28 installed in the peripheral portion of the supply tube 27. Susceptor 21 is made of quartz, and its surface for placing the substrate 20 is inclined from the horizontal plane. Both the supply tube 27 serving as the deposition chamber and the susceptor 21 are made of quartz, thereby suppressing the mixing of impurities originating from the apparatus into the film formed on the substrate 20.
2. Preparation of Raw Material Solution
Iridium chloride (iridium concentration: 0.1 mol/L) and gallium bromide (gallium concentration: 0.1 mol/L) were mixed in ultrapure water, and hydrochloric acid was added in a volume ratio of 20% to prepare an aqueous solution, which was used as a raw material solution. The volume ratio of iridium chloride to gallium bromide was 19:1.
3. Preparation for Deposition
The raw material solution 24a obtained in the process 2 described above was housed in the mist generating source 24. Next, the c-plane sapphire substrate as the substrate 20 was placed on the susceptor 21, and the temperature of the heater 28 was raised to 750° C. Next, the flow rate control valves 23a and 23b were opened to supply the carrier gas from the carrier gas supply means 22a and 22b serving as carrier gas sources into the supply tube 27. After the atmosphere in the supply tube 27 was sufficiently replaced with the carrier gas, the flow rate of the carrier gas was adjusted to 1.0 L/min and the flow rate of the carrier gas (diluted) was adjusted to 0.5 L/min, respectively. Here, oxygen was used as a carrier gas.
4. Deposition
Next, the ultrasonic vibrator was vibrated, and the vibration was propagated to the raw material solution 24a through the water 25a, whereby the raw material solution 24a was atomized to generate a mist. The mist was conveyed to the supply tube 27 by the carrier gas, and the mist thermally reacted at 750° C. under atmospheric pressure in the vicinity of the surface of the substrate 20 to form a film on the substrate 20. The film thickness was 280 nm.
When the film obtained in the process 4 described above was identified using an X-ray diffraction device, the obtained film was an $\alpha$-$Ir_2O_3$ film. The results of XRD are shown in FIG. 3. We measured the hole-effect of the obtained $\alpha$-$Ir_2O_3$ film, and found that the F-value was 0.998 and the carrier type was "p" and the obtained film was a p type semiconductor. The carrier density was $2.97 \times 10^{21}$ (/cm$^3$) and the mobility was 0.38 (cm$^2$/V·s). When the film surface was observed using an atomic force microscope (AFM), the surface roughness (Ra) was 302 nm as shown in FIG. 5. Note that the surface roughness (Ra), using the surface shape measurement results for the area in the size of 90 μm square by atomic force microscopy (AFM), was calculated based on JIS B0601.

Reference Example 2 and Comparative Reference Example 2

Figure 6B:
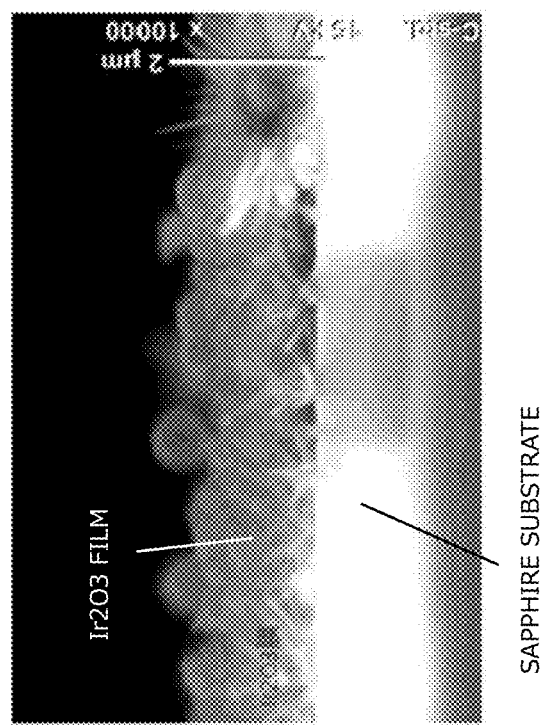
FIGS. 6A and 6B are diagrams illustrating the observation results of cross-sectional SEM.
Figure 6A:
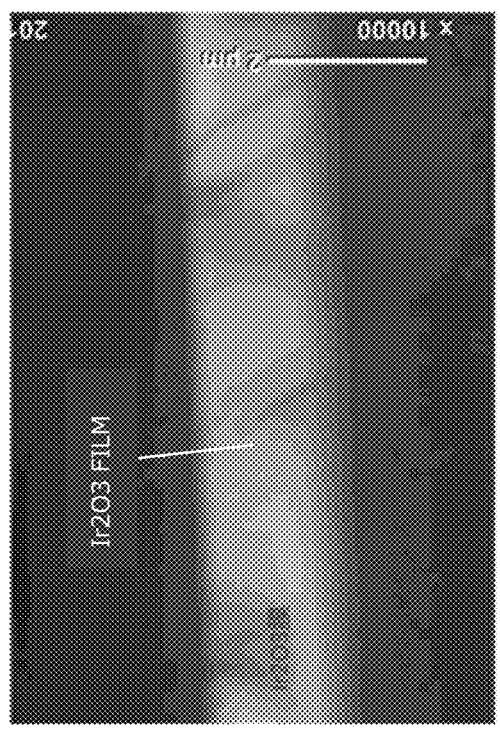

Films were obtained in the same manner as in Reference Example 1 and Comparative Example 1 except that the deposition time was longer, and were referred to as Reference Example 2 and Comparative reference Example 2, respectively. A cross section of the obtained film was observed using an SEM. The results are given in FIG. 6. As is apparent from FIG. 6, the film obtained in Reference Example 2 is in the form of a film, whereas the film obtained in Comparative Reference Example 2 grows in the form of a needle on its surface, and is not in the form of a homogeneous film.

From the results of the reference example and the comparative reference example, it can be seen that the p type oxide semiconductor film suitably used in the disclosure is excellent in film quality such as surface smoothness and crystallinity, and is therefore industrially useful, and is also excellent in electrical characteristics such as mobility.

Reference Example 3

A p type oxide semiconductor film was obtained in the same manner as in Example 1 except that the deposition time was 2 hours. Then, n− type semiconductor layer was laminated on the p type oxide semiconductor film. The n− type semiconductor layer was laminated by forming a film in the same manner as in Comparative Reference Example 1 except that gallium bromide (gallium concentration: 0.1 mol/L) was mixed with ultrapure water, hydrobromic acid was added to a volume ratio of 20% to prepare an aqueous solution, which was used as a raw material solution, the temperature of the heater was 420° C., and the deposition time was 30 minutes. The film was an $\alpha$-$Ga_2O_3$ film.

Further, to laminate the n+ type semiconductor layer on the resulting n-type semiconductor layer. The n+ type semiconductor layer was laminated by forming a film in the same manner as in Comparative Example 1 except that gallium bromide (gallium concentration: 0.1 mol/L) was mixed with ultrapure water, hydrobromic acid was added to a volume ratio of 10% to adjust an aqueous solution, and germanium oxide was added to make the raw material solution, the temperature of the heater was 390° C., and the deposition time was 30 minutes.

Ti was deposited by sputtering on the n+ type semiconductor layer of the resulting laminate body, then by performing photolithography and etching, to prepare a pn diode. The resulting pn diode was subjected to I-V measurement. The results are shown in FIG. 13. As is apparent from FIG. 13, the p type oxide semiconductor film of the reference example can realize a favorable PN junction.

Reference Example 4

1. Deposition Apparatus

Figure 2:
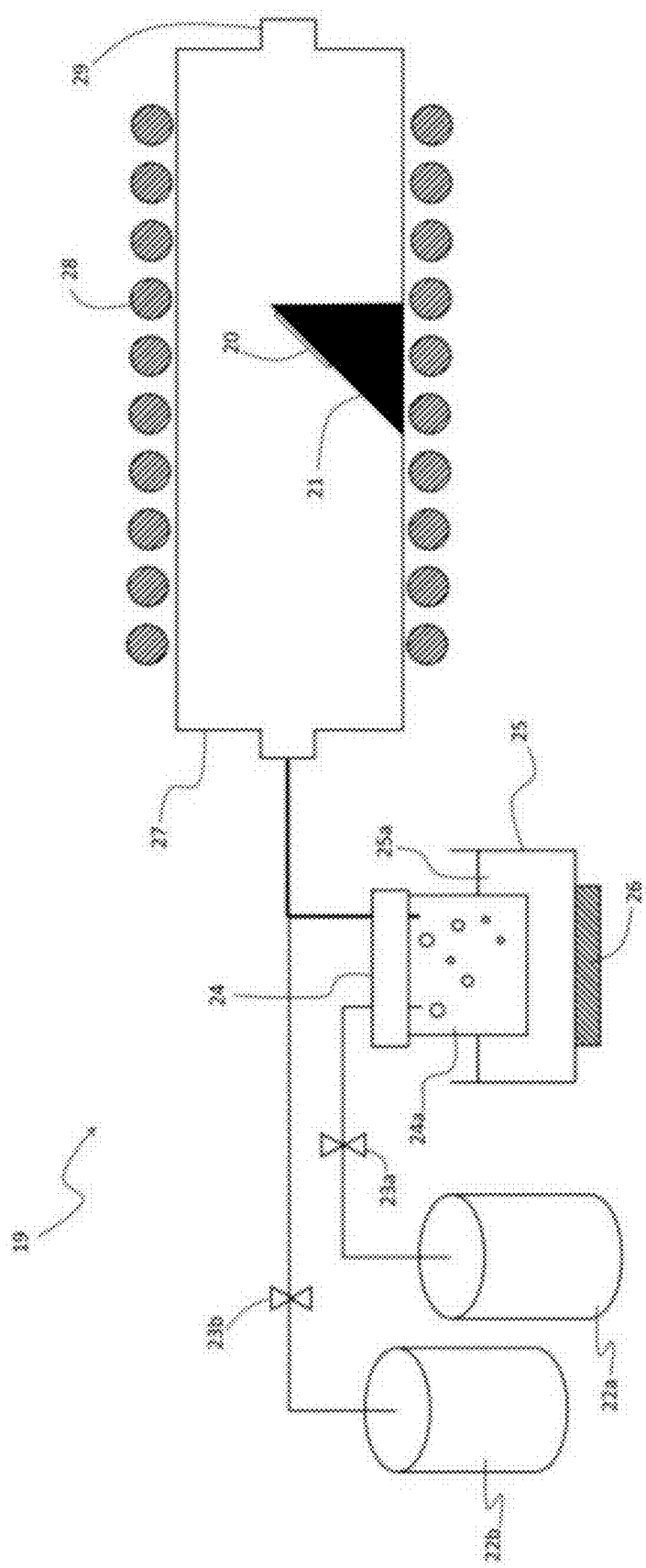
FIG. 2 is a schematic configuration diagram illustrating a deposition apparatus (mist CVD apparatus) used in a comparative reference example.

The mist CVD apparatus 19 used in Reference Example 4 will be described with reference to FIG. 2. The apparatus includes a susceptor 21 on which the substrate 20 is placed, a carrier gas supply means 22a for supplying a carrier gas, a flow rate control valve 23a for adjusting a flow rate of a carrier gas supplied from the carrier gas supply means 22a, a carrier gas (dilution) supply means 22b for supplying a carrier gas (dilution), a flow rate control valve 23b for adjusting a flow rate of a carrier gas supplied from the carrier gas (dilution) supply means 22b, a mist generating source 24 housing a raw material solution 24a, a container 25 housing water 25a, an ultrasonic vibrator 26 attached to a bottom surface of the container 25, a supply tube 27 made of a quartz tube having an inner diameter of 40 mm, and a heater 28 installed at a peripheral portion of the supply tube 27. Susceptor 21 is made of quartz, and the surface for placing the substrate 20 is inclined from the horizontal plane. Both the supply tube 27 and the susceptor 21 serving as the deposition chamber are made of quartz, thereby suppressing the mixing of impurities originating from the apparatus into the film formed on the substrate 20.

2. Preparation of Raw Material Solution

Gallium bromide and magnesium bromide were mixed in ultrapure water, and the aqueous solution was adjusted so that the atomic ratio of magnesium to gallium was 1:0.01 and 0.1 mol/L of gallium bromide, and at this time, hydrogen halide acid was contained at a volume ratio of 20%, which was used as a raw material solution.

3. Preparation for Deposition

The raw material solution 24a obtained in the process 2 described above was housed in the mist generating source 24. Next, as the substrate 20, a sapphire substrate having an n+ type semiconductor layer ($\alpha$-$Ga_2O_3$) formed by mist-CVD on its surface was placed on the susceptor, and the heater 28 was operated to raise the temperature in the deposition chamber 27 to 520° C. Next, the flow rate control valves 23a and 23b were opened, the carrier gas was supplied from the carrier gas supplying means 22a and 22b serving as carrier gas sources into the deposition chamber, the atmosphere of the deposition chamber 27 was sufficiently replaced with the carrier gas, and then the flow rate of the carrier gas was adjusted to 1 L/min and the flow rate of the carrier gas (dilute) was adjusted to 1 L/min, respectively. Nitrogen was used as the carrier gas.

4. Deposition

Next, the ultrasonic vibrator 26 was vibrated at 2.4 MHz, and the vibration was propagated to the raw material solution 24a through the water 25a, thereby the raw material solution 24a was atomized to generate a mist. This mist was introduced into the deposition chamber 27 by a carrier gas, and the mist reacted in the deposition chamber 27 at 520° C. under atmospheric pressure, thereby forming a semiconductor film on the substrate 20. The deposition time was 60 minutes.

5. Evaluation

When the phase of the film obtained in the process 4 described above was identified using an XRD diffractometer, the film obtained using hydrobromic acid as the hydrohalic acid was $\alpha$-$Ga_2O_3$.

Figure 14:
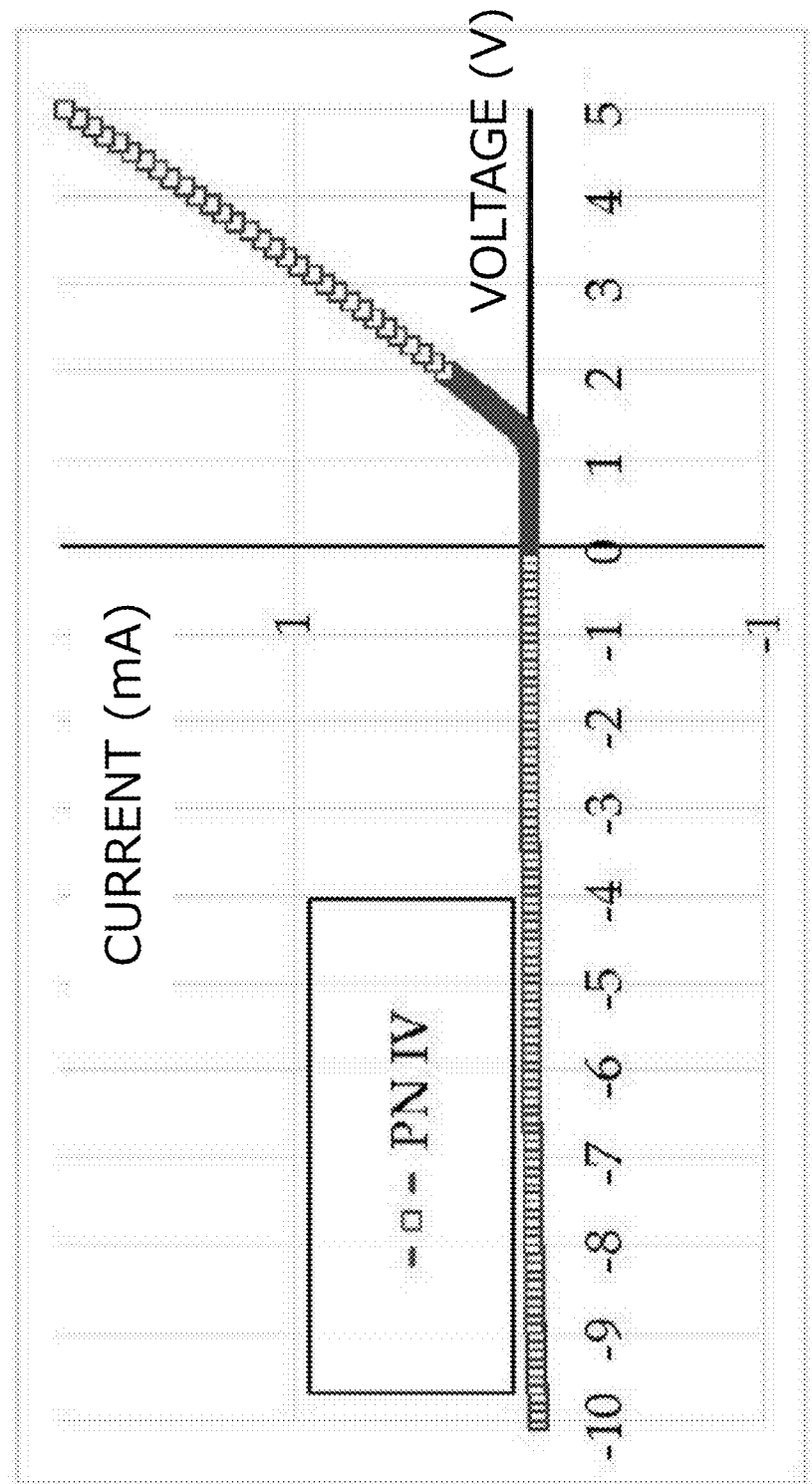
FIG. 14 is a diagram illustrating the results of I-V measurement in the reference example.

In order to confirm whether magnesium functioned properly as p type dopants in the p type semiconductor layer, the $\alpha$-$Ga_2O_3$ film obtained in the process 4 was subjected to IV-measurement. The results of the IV measurements are shown in FIG. 14. As apparent from FIG. 14, it shows excellent rectification, and the n+ type semiconductor layer and the p type semiconductor layer forms a good PN junction, and magnesium was found to function properly as a p type dopant.

INDUSTRIAL APPLICABILITY

Semiconductor apparatus of the disclosure can be used in any field such as semiconductors (compound semiconductor electronic devices, for example), electronic components, electrical equipment parts, optical and electrophotography-related devices and industrial devices. Especially, it is useful for power devices because of excellent p type semiconductor properties.

EXPLANATION OF NUMBERS 1 deposition apparatus
2 quartz tube
3 heater
4 material placement table
5 raw materials
6 substrate
7 susceptor
11a first n+ type semiconductor layer
11b second n+ type semiconductor layer
12 n type semiconductor layer
13 p type semiconductor layer
14a gate electrode
14b source electrode
14c drain electrode
15 gate insulating film
16 p+ type semiconductor layer
17 p+ type semiconductor layer
19 mist CVD apparatus
20 substrate
21 susceptor
22a carrier gas supply means
22b carrier gas (dilution) supply means
23a flow control valve
23b flow control valve
24 mist generating source
24a raw material solution
25 container
25a water
26 ultrasonic vibrator
27 supply tube
28 heater
29 exhaust port

The invention claimed is:

1. A semiconductor apparatus comprising:
an n type semiconductor layer including a crystalline oxide semiconductor having a corundum structure as a main component;
a channel layer including an oxide semiconductor; and
an electric field shield layer and a gate electrode that are respectively laminated directly or through other layers on the n type semiconductor layer,
wherein the electric field shield layer includes a p type oxide semiconductor, and is embedded in the n type semiconductor layer deeper than the gate electrode, and
wherein the oxide semiconductor included in the channel layer and the p type oxide semiconductor have different compositions.

2. The semiconductor apparatus according to claim 1, wherein the p type oxide semiconductor includes a metal oxide containing a d-block metal of the periodic table or a metal belonging to Group 13 of the periodic table.

3. The semiconductor apparatus according to claim 1, wherein the p type oxide semiconductor includes a metal oxide containing a metal of Group 9 or Group 13 of the periodic table.

4. The semiconductor apparatus according to claim 1, wherein the n type semiconductor layer contains an oxide semiconductor containing a Group 13 metal as a main component.

5. The semiconductor apparatus according to claim 1, wherein the semiconductor apparatus includes an insulated gate type semiconductor device or a Schottky gate.

6. The semiconductor apparatus of claim 1, further including a Schottky barrier structure.

7. The semiconductor apparatus according to claim 1, wherein the semiconductor apparatus includes a power device.

8. The semiconductor apparatus according to claim 1, wherein the semiconductor apparatus includes a power module, an inverter, or a converter.

9. A semiconductor system comprising a semiconductor apparatus, wherein the semiconductor apparatus is a semiconductor apparatus according to claim 1.

10. The semiconductor apparatus according to claim 2, wherein the p type oxide semiconductor includes a metal oxide containing a metal of Group 9 or Group 13 of the periodic table.

11. The semiconductor apparatus according to claim 2, wherein the n type semiconductor layer contains an oxide semiconductor containing a Group 13 metal as a main component.

12. The semiconductor apparatus according to claim 3, wherein the n type semiconductor layer contains an oxide semiconductor containing a Group 13 metal as a main component.

13. The semiconductor apparatus according to claim 10, wherein the n type semiconductor layer contains an oxide semiconductor containing a Group 13 metal as a main component.

14. The semiconductor apparatus according to claim 2, wherein the semiconductor apparatus includes an insulated gate type semiconductor device or a Schottky gate.

15. The semiconductor apparatus according to claim 3, wherein the semiconductor apparatus includes an insulated gate type semiconductor device or a Schottky gate.

16. The semiconductor apparatus according to claim 4, wherein the semiconductor apparatus includes an insulated gate type semiconductor device or a Schottky gate.

17. The semiconductor apparatus according to claim 10, wherein the semiconductor apparatus includes an insulated gate type semiconductor device or a Schottky gate.

18. The semiconductor apparatus according to claim 11, wherein the semiconductor apparatus includes an insulated gate type semiconductor device or a Schottky gate.

19. The semiconductor apparatus according to claim 12, wherein the semiconductor apparatus includes an insulated gate type semiconductor device or a Schottky gate.

20. The semiconductor apparatus according to claim 13, wherein the semiconductor apparatus includes an insulated gate type semiconductor device or a Schottky gate.

21. A semiconductor apparatus comprising:
an n type semiconductor layer including a crystalline oxide semiconductor as a main component;
a channel layer including an oxide semiconductor; and
a p type semiconductor layer and a gate electrode that are respectively laminated directly or through other layers on the n type semiconductor layer,
wherein the p type semiconductor layer includes a p type oxide semiconductor, and is embedded in the n type semiconductor layer deeper than the gate electrode, and
wherein the oxide semiconductor included in the channel layer and the p type oxide semiconductor have different compositions.

22. A semiconductor apparatus comprising: an n type semiconductor layer including a crystalline oxide semiconductor as a main component; and p type semiconductor layer and a gate electrode that are respectively laminated directly or through other layers on the n type semiconductor layer, wherein the p type semiconductor layer includes a p type oxide semiconductor, and is embedded in the n type semiconductor layer deeper than the gate electrode, and wherein the p type oxide semiconductor contains a crystal or a mixed crystal of a metal oxide containing iridium.

* * * * *